(12) United States Patent
Krishnamoorthy et al.

(10) Patent No.: US 11,742,808 B1
(45) Date of Patent: Aug. 29, 2023

(54) COMPACT PULSED POWER SUPPLIES

(71) Applicant: University of Houston System, Houston, TX (US)

(72) Inventors: Harish S. Krishnamoorthy, Missouri City, TX (US); Yu Yao, Cupertino, CA (US)

(73) Assignee: University of Houston System, Houston, TX (US)

( * ) Notice: Subject to any disclaimer, the term of this patent is extended or adjusted under 35 U.S.C. 154(b) by 0 days.

(21) Appl. No.: 17/945,811

(22) Filed: Sep. 15, 2022

(51) Int. Cl.
*H03F 3/217* (2006.01)
*H02M 7/5387* (2007.01)

(52) U.S. Cl.
CPC .................................. *H03F 3/2178* (2013.01)

(58) Field of Classification Search
CPC ...... H02M 7/53871; H02M 1/12; H02M 1/44; H02M 1/0012; H02M 1/0019; H02M 1/0058; H02M 3/285; H02M 3/33573; H02M 7/4837; H02M 1/15; Y02B 70/10; H03F 3/2178
USPC ............... 330/10, 251, 207 A, 297
See application file for complete search history.

(56) References Cited

U.S. PATENT DOCUMENTS

| | | | |
|---|---|---|---|
| 5,485,365 A | 1/1996 | Dan-Harry | |
| 6,034,565 A * | 3/2000 | Schweighofer | H02M 5/458 330/10 |
| 9,190,898 B2 | 11/2015 | Brinlee et al. | |
| 9,405,035 B2 | 8/2016 | Tyshko | |
| 9,450,506 B2 | 9/2016 | Perreault et al. | |
| 9,536,423 B2 | 1/2017 | Griswold et al. | |
| 9,989,604 B2 | 6/2018 | Griswold et al. | |
| 10,910,861 B2 | 2/2021 | Tian et al. | |
| 11,336,205 B1 * | 5/2022 | Brothers | H02M 7/4837 |
| 11,362,585 B2 | 6/2022 | Rizzolatti et al. | |
| 2022/0166341 A1 | 5/2022 | Afridi et al. | |

FOREIGN PATENT DOCUMENTS

WO 2021183915 A1 9/2021

OTHER PUBLICATIONS

Yao, Yu et al. "GaN-Based Two Stage Converter With High Power Density and Fast Response for Pulsed Load Application." IEEE Transactions on Industrial Electronics, vol. 69, No. 10, Oct. 2022. pp. 10035-10044.

(Continued)

*Primary Examiner* — Hieu P Nguyen
(74) *Attorney, Agent, or Firm* — Blank Rome LLP

(57) ABSTRACT

A nuclear magnetic resonance (NMR) power supply system and method are disclosed. The architecture adopts a two-stage topology to reduce the required capacitance by over ten times, leading to a four-fold improvement in power density. The first stage is an isolated converter that only supplies average power, therefore input filter and transformer sizes can be reduced. The second stage is a fast response DC-DC converter followed by a RF transmitter to produce a pulsed RF signal, so that the mid-point voltage after the first stage can be allowed to droop considerably, leading to much smaller sized capacitors. These and other embodiments enforce the isolated converter to only transfer average power, which reduces the power rating and the volume of the system's transformer.

20 Claims, 9 Drawing Sheets

(56) References Cited

OTHER PUBLICATIONS

Yao, Yu et al. "High Density Power Converter Design for Pulsed NMR Applications." 2021 IEEE Energy Conversion Congress and Exposition (ECCE) 978-1-7281-5135-9/21. pp 5927-5932.

Yao, Yu et al. "Improved Circuit Design and Adaptive Burst Mode Control in PSFB Converters for Higher Efficiency Over a Wide Power Range." IEEE Access, vol. 10, Jan. 26, 2022. doi 10.1109/Access.2022.3144024. pp. 9152-9163.

Zhang, Yiming et al. "Review of nuclear magnetic resonance magnet for oil well logging," in IEEE Transactions on Applied Superconductivity, vol. 10, No. 1, pp. 763-766, Mar. 2000.

Yarman, C.E. et al. "A new inversion method for NMR signal processing," 2013 5th IEEE International Workshop on Computational Advances in Multi-Sensor Adaptive Processing (CAMSAP), St. Martin, 2013, pp. 260-263.

Zhen, J. et al. "Class D RF amplifier for 20 MHz NMR Mouse sensor," 2012 Sixth International Conference on Sensing Technology (ICST), Kolkata, 2012, pp. 13-16.

Zhen, J. et al. "A compact Class D RF power amplifier for mobile nuclear magnetic resonance systems," in Review of Scientific Instruments, 88:7, 074704, Jul. 2017.

AVX Corporation, "X7RDielectric General Specifications," 06035C103KAT2A-AVX-datasheet. https://datasheet.octopart.com/06035C103KAT2A-AVX-datasheet-148183.pdf (Accessed Aug. 11, 2020).

Braun, W.D. et al. "MRI Compatible DC Modulator for an Envelope Tracking Transmitter," 2019 20th Workshop on Control and Modeling for Power Electronics (COMPEL), Toronto, ON, Canada, 2019, pp. 1-4.

Sabate, J. et al. "High-power high-fidelity switching amplifier driving gradient coils for MRI systems," 2004 IEEE 35th Annual Power Electronics Specialists Conference (IEEE Cat. No.04CH37551), Aachen, Germany, 2004, pp. 261-266 vol. 1.

Gu, Y. et al. "Research on low input current ripple two-stage converter for low frequency pulsed-power applications," in IET Transactions on Power Electronics, vol. 13, No. 2, pp. 340-345, Feb. 2020.

Nayanasiri, D. et al. "Step-Down DC-DC Converters: An Overview and Outlook." Electronics 2022, 11, 1693. 20 pages. https://www.mdpi.com/2079-9292/11/11/1693/htm.

Mortazavizadeh, S.A. et al. "High Frequency, High Efficiency, and High Power Density GaN-Based LLC Resonant Converter: State-of-the-Art and Perspectives." Appl. Sci 2021, 11, 11350. 22 pages. https://www.mdpi.com/2076-3417/11/23/11350/pdf?version=1638417700.

Okilly, A. H. et al. "Inrush Current Control of High Power Density DC-DC-Converter." Energies 2020, 13, 4301. 22 pages. https://www.mdpi.eom/1996-1073/13/17/4301.

Minfan Fu, et al. "Optimal Design of Planar Magnetic Components for a Two-Stage GaN-Based DC-DC Converter." Apr. 1, 2019.

\* cited by examiner

COMPACT PULSED POWER SUPPLIES

GOVERNMENT SPONSORSHIP

None.

FIELD

The embodiments disclosed herein are in the field of nuclear magnetic resonance (NMR) power supply/converter systems and methods. More particularly, the embodiments disclosed herein relate to NMR power supply systems and methods having a two-stage converter architecture, which, inter alia, enforce the system's isolated converter to only transfer average power, which reduces the power rating and the volume of the system's transformer.

BACKGROUND

NMR spectroscopy utilizing pulsed radio frequency (RF) signals has been widely used in several applications such as subsea (or downhole) formation analysis, magnetic resonance imaging (MRI), etc. Since pulsed RF signal's instantaneous power can be over ten times of its average power, converters designed in peak power rating causes lower power density and higher cost, mainly due to the large capacitor bank requirement for energy transfer.

NMR is widely used in logging while drilling (LWD) and wireline (WL) operations. Compared to class A or class AB amplifiers, class D amplifiers have a significantly higher power efficiency to produce radio frequency (RF) signal and excite the NMR probe. A typical power converter for LWD is shown in FIG. 1A which is a schematic diagram illustrating a typical power converter 100 for an antenna in NMR applications. This power converter includes an input filter 101, an energy storage block 104 and a class D amplifier 108. The class D amplifier 108 includes transformer 110 and transmitter antenna 114. As the operating waveforms show in FIG. 1B, the transmitter antenna broadcasts an RF signal out during on-state and the receiver antenna collects the echo radio during off-state, after which the waveforms are analyzed to detect the geological structure.

The traditional power converter's operating principle is as follows: a) during the off-state, S1 turns on to charge the bulky capacitor C2, the class D amplifier is off and the transmitter antenna is inactive; and b) during the on-state, S1 turns off, C2 supplies the voltage for the class D amplifier, and S2 and S3 turn on alternately to produce a square wave which is boosted by the transformer to the secondary side. The boosted square wave voltages $V_{sec}$ goes through a inductor-capacitor (LC) resonant tank to produce RF sine waveform for the antenna to transmit. Input source $V_{in}$ does not supply power to class D amplifier directly, otherwise the RF noise may affect the signal integrity.

There are three major drawbacks for this type of power converters:

During the on-state, S1 turns off and the entire energy is supplied by capacitor C2. In order to maintain the linearity of class D amplifier, the voltage across C2 can't drop dramatically. Therefore, large capacitance value (typically millifarads) has to be chosen, which results in a bulky volume, especially in the high voltage application. Especially in extreme environment applications such as downhole oil and gas, high temperature capacitors need to be adopted, which decreases the power density further. To make the matters worse, popular high temperature capacitors such as X7R lose capacitance (by over 50%) at very high temperatures, so redundant design is also needed for such an extreme operating condition.

In consideration of providing isolation, power converters as shown in FIG. 1A need to use transformers with peak power ratings in the range of several kilowatts. However, peak power is required only for around ten percent of every period, which leads to a significant underutilization of the transformer's rating. It makes the transformer occupy a large volume and increases the cost of the whole power converter.

An input filter is also needed to reduce the effect of pulse frequency harmonics on the input source. The low pulse frequency forces the input filter's cut-off frequency to be extremely small, which leads to large inductance and capacitance values. In consideration of the high-temperature environment and high voltage rating, the input filter also greatly reduces power density.

These aspects not only make the existing technological solutions bulky, but also lead to reliability issues, especially under shocks, vibrations, and other extreme environments.

Focusing on these issues, a novel power converter architecture is needed to increase power density, mainly by reducing the size of the energy storage capacitor C2, transformer, and input filter—the main passive components in the converter.

Thus, it is desirable to provide an NMR power supply system and method that are able to overcome the above disadvantages.

These and other advantages of the present invention will become more fully apparent from the detailed description of the invention herein below.

SUMMARY

Embodiments are directed to an NMR power supply system including an isolated converter including a transformer. The isolated converter is configured to have a variable voltage at an output thereof. The NMR power supply system also includes an energy storage component. The variable voltage is input to the energy storage component, and the energy storage component is configured to allow the variable voltage to have a voltage droop of greater than 2% from a peak voltage of the variable voltage. The NMR power supply system further includes a DC-DC converter. A variable voltage from the energy storage component is input to the DC-DC converter, and the DC-DC converter is configured to convert the variable voltage from the energy storage component to a steady output voltage relative to the variable voltage from the energy storage component. The NMR power supply system yet further includes a non-isolated RF signal generator including an NMR coil or an antenna. The steady output voltage is input to the RF signal generator, and the RF signal generator is configured to transmit an RF signal using the NMR coil or antenna. These and other embodiments enforce the isolated converter to only transfer average power, which reduces the power rating and the volume of the transformer.

Embodiments are also directed to a method including outputting a variable voltage from an isolated converter. The isolated converter includes a transformer. The method also includes inputting the variable voltage to an energy storage component. The energy storage component allows the variable voltage to have a voltage droop of greater than 2% from a peak voltage of the variable voltage. The method further includes inputting a variable voltage from the energy storage component to a DC-DC converter. The DC-DC converter converts the variable voltage from the energy storage component to a steady output voltage relative to the variable voltage from the energy storage component. The method yet further includes inputting the steady output voltage to a non-isolated RF signal generator including an NMR coil or an antenna. The RF signal generator transmits an RF signal using the NMR coil or antenna.

BRIEF DESCRIPTION OF THE DRAWINGS

The foregoing summary, as well as the following detailed description, will be better understood when read in conjunction with the appended drawings. For the purpose of illustration only, there is shown in the drawings certain embodiments. It's understood, however, that the inventive concepts disclosed herein are not limited to the precise arrangements and instrumentalities shown in the figures.

DETAILED DESCRIPTION

Figure 1A:
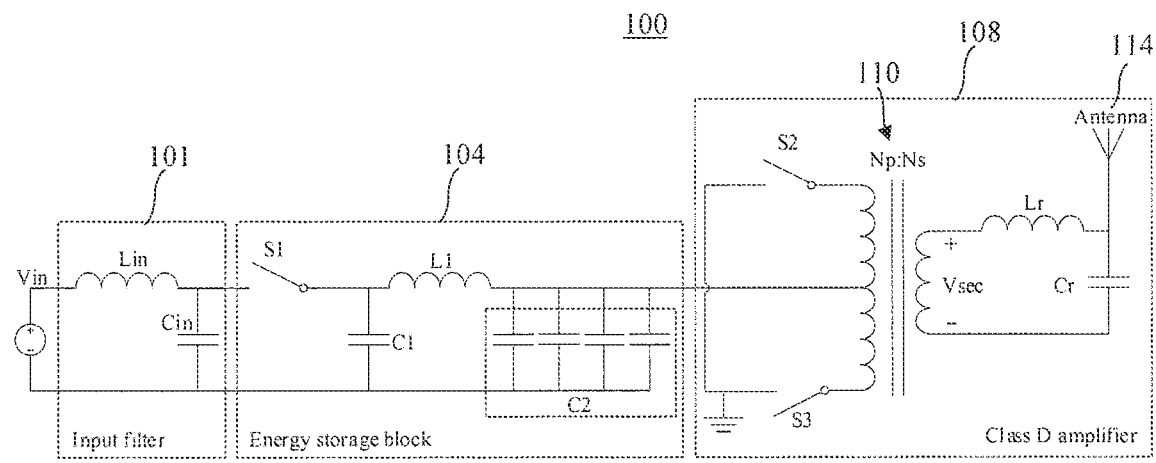
FIG. 1A is a schematic diagram illustrating a typical power converter for an antenna in NMR applications.
Figure 1B:
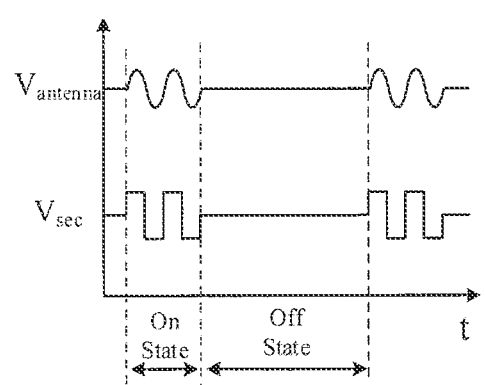
FIG. 1B is a plot illustrating operating waveforms for the converter shown in FIG. 1A.

It is to be understood that the figures and descriptions of the present invention may have been simplified to illustrate elements that are relevant for a clear understanding of the present embodiments, while eliminating, for purposes of clarity, other elements found in a typical power converter/supply or typical method of using an power converter/supply. Those of ordinary skill in the art will recognize that other elements may be desirable and/or required in order to implement the present embodiments. However, because such elements are well known in the art, and because they do not facilitate a better understanding of the present embodiments, a discussion of such elements is not provided herein. It is also to be understood that the drawings included herewith only provide diagrammatic representations of the presently preferred structures of the present invention and that structures falling within the scope of the present embodiments may include structures different than those shown in the drawings. Reference will now be made to the drawings wherein like structures are provided with like reference designations.

Before explaining at least one embodiment in detail, it should be understood that the concepts set forth herein are not limited in their application to the construction details or component arrangements set forth in the following description or illustrated in the drawings. It should also be understood that the phraseology and terminology employed herein are merely for descriptive purposes and should not be considered limiting.

It should further be understood that any one of the described features may be used separately or in combination with other features. Other embodiments of devices, systems, methods, features, and advantages described herein will be or become apparent to one with skill in the art upon examining the drawings and the detailed description herein. It's intended that all such additional devices, systems, methods, features, and advantages be protected by the accompanying claims.

Mission-critical applications involving pulsed power (such as NMR for subterranean exploration, Magnetic Resonance Imaging (MRI), etc.) typically store required energy in capacitor banks, batteries, or super-capacitors to be able to discharge quickly when needed. These energy storage mechanisms severely reduce the power density, and also compromise the reliability of the conversion system. In mission-critical applications such as downhole logging, the capacitor banks can be several times larger than the rest of the NMR electronics and are usually a top reason for power supply failures. These result in high costs in engineering, manufacturing and operation.

Embodiments described herein will be used to develop converters with a small footprint to interface with pulsed power platforms. In addition to NMR, the power supply could realize miniaturization of other pulsed power systems, such as well-logging tools of all sensing methods, pulsed laser equipment, etc.

Example Architecture of System

Figure 2A:
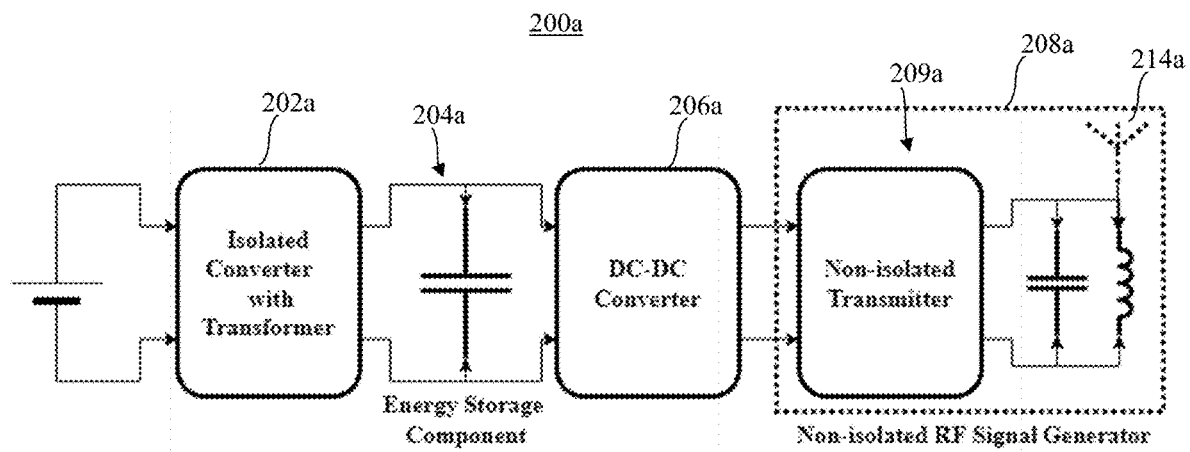
FIG. 2A is a schematic diagram generally illustrating a power converter for pulsed power in NMR applications.
Figure 2B:
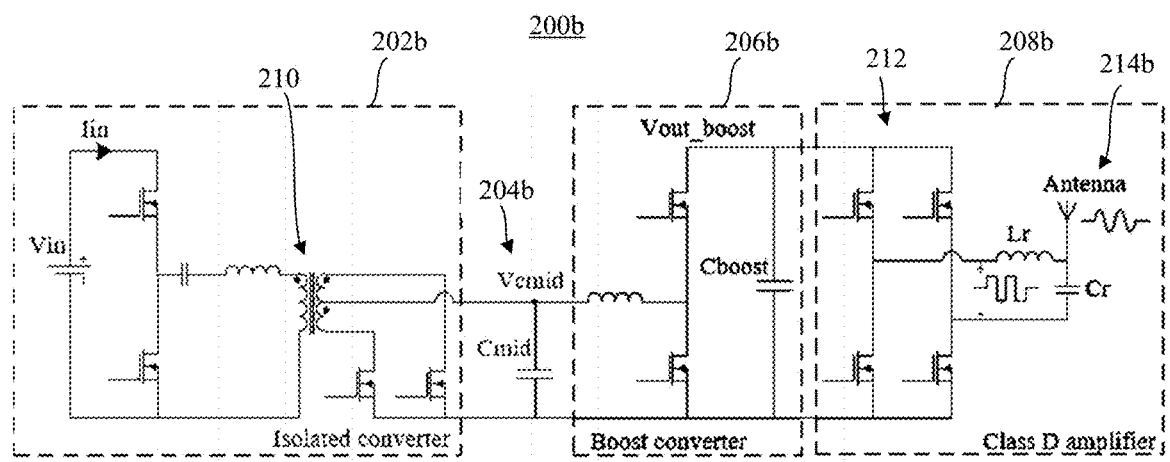
FIG. 2B is a schematic diagram illustrating an example power converter for pulsed power in NMR applications.
Figure 2C:
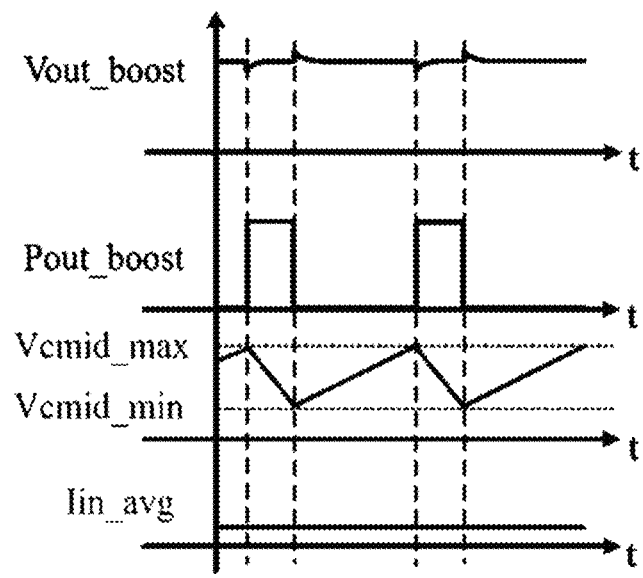
FIG. 2C is a plot illustrating operating waveforms for the power converter shown in FIG. 2B.

The two-stage power converter 200a architecture is generally shown in FIG. 2A and includes an isolated converter 202a (with transformer), an energy storage component/ block 204a, a DC-DC converter 206a, and a non-isolated RF signal generator 208a. The non-isolated RF signal generator 208a includes a non-isolated transmitter 209a and a transmitter antenna 214a. FIG. 2B illustrates a two-stage power converter 200b for pulsed power in NMR applications, which is one example of the power converter 200a generally shown in FIG. 2A. The exemplary power converter 200b includes an isolated converter 202b (with transformer 210), a capacitor (or capacitor block) 204b, a boost converter 206b, and a non-isolated RF signal generator 208b. The non-isolated RF signal generator 208b includes fast switches (e.g., Gallium Nitride (GaN) switches and/or SiC switches) 212 and a transmitter antenna 214b. Main operating waveforms for the power converter 200b are shown in FIG. 2C. The isolated converter in FIG. 2B ensures that the load is isolated to the input source and only transmits the average power to capacitor $C_{mid}$. Thus, the power rating of this isolated converter will be lower, typically one tenth of the peak power needed by the pulsed load. Since $C_{mid}$ is charged by the average power during 90% of the time and discharged by the pulsed power in roughly 10% of the time, the voltage across $C_{mid}$ varies periodically. Therefore, a boost converter is designed as the second stage in this topology to transfer the variable $V_{Cmid}$ to constant output $V_{out\_boost}$ as the class D amplifier power supply.

Some benefits achieved by this novel power system topology include the following:
1) The isolated converter outputs nearly constant power, which is the average of the load power in the next stage. Therefore, the power rating of the transformer gets reduced, hence reduces the size and cost.
2) The isolated converter outputting constant power also means that the input current drawn from the source is constant; hence, the pulsed frequency harmonics do not affect other circuits connected to the same input and also leads to lower input filter size.
3) Since there is a boost converter to keep the class D transmitter's (RF signal generator's) input voltage regulated, voltage across $C_{mid}$ isn't required to be constant. In other words, as the main energy storage component, the energy utilization factor increases dramatically. Thus, the value of Caw will be significantly smaller compared to the storage capacitor C2 in FIG. 1A.
4) For NMR applications that require a variable duty cycle (anywhere from 1% to 25%), embodiments of the novel system can achieve the design specifications in an efficient manner using adaptive control methods. Examples for such methods are the adaptive burst mode control and Vin feed-forward control techniques described herein. Due to the two-stage architecture, the droop at the DC-DC converter output can be maintained within a tight range (as described by the design specifications) even at different load profiles and duty cycles.

These four benefits increase the power density of the power system architecture, and will enable compact and efficient power conversion systems for pulsed power applications.

Design and Analysis

A 300 V DC to 400 V RF, 5 kW peak power converter is taken as an example to show the design of parameters. Wide band gap semiconductors such as gallium nitride (GaN) or silicon carbide (SiC) devices can be used in this application (e.g., GS66516B GaN transistor), considering their wide band-gap suitable for very high temperatures and, especially for GaN devices, low GaN on-state resistance at high current rating. The specifications of the converter used in this disclosure are listed in Table 1 below.

TABLE 1

| Converter Specifics | | |
| --- | --- | --- |
| Symbol | Parameter | Value |
| $V_{in}$ | Input voltage | 300 V |
| $V_{Cmid}$ | Voltage across Cmid | 250 V-370 V |
| $V_{out\_boost}$ | Output of boost converter | 400 V |
| $V_{out\_boost\_pkpk}$ | The under/overshoot range of boost's output | 1% |
| $P_{load\_on}$ | Average load power during on state | 2 kW |
| $P_{load\_on\_peak}$ | Peak load power during on state | 4 kW |
| $T_{on}$ | On time of single scaning period | 30 us |
| $T_{off}$ | Off time of single scaning period | 270 us |
| $P_{load\_average}$ | Average load power | 0.5 kW |
| $f_{RF}$ | RF signal frequency | 500 kHz |
| $f_{pulse}$ | Pulse load frequency | 3.3 kHz |

Cmid Value Design

Since the isolated converter only processes/handles the average power, the power difference between the input and pulse load should be compensated by the mid-point capacitor $C_{mid}$. From Table 1, it can be found that the input power is 1 kW while the load power (on-state) is 10 kW. Thus, the energy needed from the mid-point capacitor $C_{mid}$, E, can be deduced by Eq. (1).

$$E = (10 \text{ kW} - 1 \text{ kW}) \times \text{Pulsewidth} \quad (1)$$

Here, the pulse width is 30 µs, so E is calculated as 0.27 J.

$$E = \frac{1}{2} C_{mid} \left( V_{Cmid\_max}^2 - V_{Cmid\_min}^2 \right) \quad (2)$$

If the midpoint voltage is set to a stiff range like 148.5 V≤$V_{Cmid}$≤150V (difference of 1% of $V_{Cmid}$), the value of midpoint capacitor can be calculated with Eq. (2). The result is around 1.2 mF which is a very large value. In addition, if the power supply of the class D transmitter has a requirement of 1% variation for the converter in FIG. 1A, the voltage variation range for $V_{C2}$ is also 1%, since there is no regulator after the storage capacitor C2. Therefore, the minimum capacitance value of C2 will also be 1.2 mF in this condition (even without considering the high temperature capacitance drift).

In order to reduce the size of mid-point capacitor, the voltage droop range should be maximized (even up to 80%) to increase energy utilization factor. In Table 1, the maximum voltage across Caw is chosen as 150 V to make a fair comparison with the storage capacitor C2 in the conventional power converter, whose bias voltage is around 150 V, if the same input source is used. The minimum voltage across $C_{mid}$ is set as 130 V to allow for a practically achievable step up ratio of boost converter design. Then, the minimum mid-point capacitance value calculated using Eq. (2) will be $C_{mid}$=96 µF, which is 12 times smaller than energy storage capacitor C2 in FIG. 1A. In practice, the input current cannot be limited as a single constant value because the average value of the load power always has some drift due to potential changes in pulse-width, device characteristics and application environment. To deal with this practical drift, the input current should be allowed to vary within a narrow range.

In consideration of certain voltage rating (>150 V) for mid-point capacitors (C2 in conventional topology and $C_{mid}$ in this disclosure's novel topology), tiny surface mount device (SMD) ceramic capacitors cannot be adopted. Therefore, this disclosure's novel converter's high power density advantage becomes more prominent with the use of an aluminum electrolytic capacitor.

Isolated Converter Control Loop Design

The isolated converter is designed to only output/handle average power to next stage. Therefore, a constant power control loop is adopted as shown in FIG. 3, which is a schematic diagram illustrating an isolated converter closed loop controller for the isolated converter shown in FIG. 2A.

Figure 3:
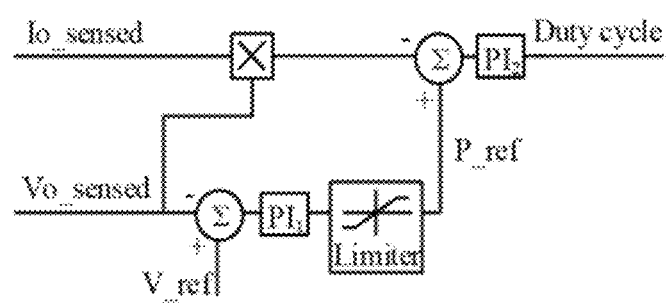
FIG. 3 is a schematic diagram illustrating an isolated converter closed loop controller for the isolated converter shown in FIG. 2A.

In FIG. 3, output voltage Vo and average output current Jo are sampled and sent to controller. The outer voltage loop is designed with a very slow PI' (bandwidth is $\frac{1}{10}^{th}$ of pulse frequency) to produce the constant power reference. The upper limit of limiter is set as the reference of average power at maximum load. For the inner average power loop, Io and Vo are multiplied to get the power information and $PI_2$ is designed with a high bandwidth ($\frac{1}{5}^{th}$ of switching frequency) to make sure the average power sensed can accurately follow the power reference $P_{\_ref}$. Due to this average power controller, the isolated converter can only output average power and do not respond to pulsed load transient. A constant-current control loop can be adopted as an alternative to the constant-power control loop.

Input Filter Design

For standard conducted emissions test, the low frequency harmonics caused by a load should be limited in the range of the particular application requirements at the input side.

The 3.3 kHz harmonics in the conventional approach (which depends on load specifications) can be calculated as 1.45 A. To reduce current harmonics from 1.45 A to 56 mA, a −28 dB gain should be achieved by an input LC filter at 3.3 kHz. Since the LC filter is a second order filter which has −40 dB gain decrease per decade and −12 dB gain decrease per double frequency, the LC resonant frequency should be below than (3.3 kHz/10)*2=660 Hz. To achieve such a low frequency, a 470 uH inductor and 150 uH capacitor would need to have been adopted in this application using conventional techniques.

On the contrast, the novel system's topology has already set the bandwidth of outer voltage loop at $\frac{1}{10}^{th}$ of pulse frequency. Since it is a two pole system, the control loop can naturally achieve −40 dB gain at pulse frequency, so the LC filter is completely not needed in the novel system converter. Only some small capacitors are connected at input side to filter out the 400 kHz switching frequency.

Simulation and Experimental Result

Figure 4A:
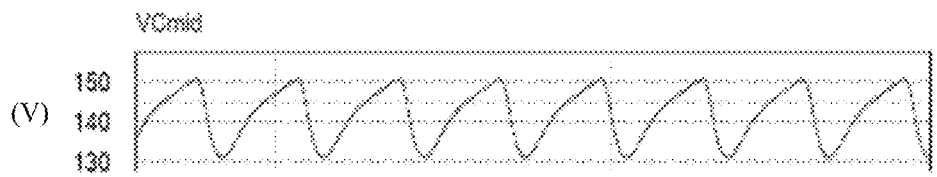
FIG. 4A is a plot illustrating mid-point capacitor voltage ($V_{Cmid}$) for the power converter shown in FIG. 2A.
Figure 4B:
FIG. 4B is a plot illustrating output voltage of boost converter ($V_{out\_boost}$) for the power converter shown in FIG. 2A.
Figure 4C:
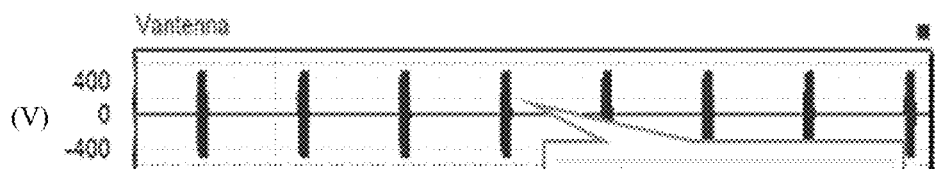
FIG. 4C is a plot illustrating antenna output voltage ($V_{antenna}$) for the power converter shown in FIG. 2A.
Figure 4D:
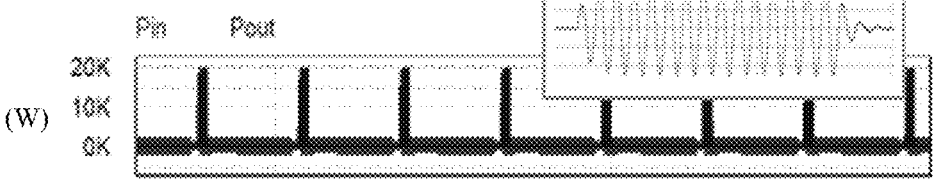
FIG. 4D is a plot illustrating converter input power and output power ($P_{in}$ and $P_{out}$) for the power converter shown in FIG. 2A.
Figure 4E:
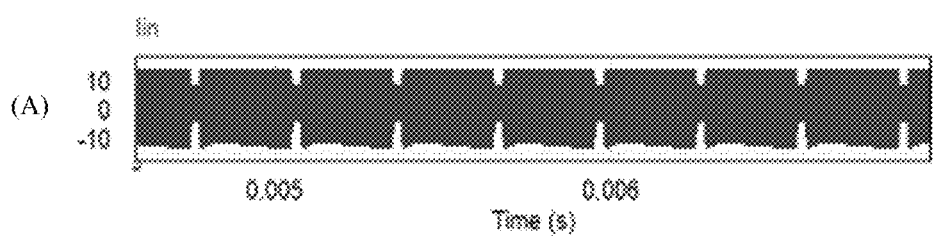
FIG. 4E is a plot illustrating input current after input capacitor ($I_{in}$) for the power converter shown in FIG. 2A.

The PSIM (i.e., an electronic circuit simulation software package) simulation waveforms are shown in FIGS. 4A-4E. Specifically, FIG. 4A is a plot illustrating mid-point capacitor voltage ($V_{Cmid}$) for the power converter shown in FIG. 2B; FIG. 4B is a plot illustrating output voltage of boost converter ($V_{out\_boost}$) for the power converter shown in FIG. 2B; FIG. 4C is a plot illustrating antenna output voltage ($V_{antenna}$) for the power converter shown in FIG. 2B; FIG. 4D is a plot illustrating converter input power and output power ($P_{in}$ and $P_{out}$) for the power converter shown in FIG. 2B; and FIG. 4E is a plot illustrating input current after input capacitor ($I_{in}$) for the power converter shown in FIG. 2B.

It can be concluded that $V_{Cmid}$ varies in the designed range (130 V to 150 V) and $V_{out\_boost}$ variation is less than 1%, which meets the specification requirements. The input and output power waveforms show how the pulsed peak power requirement is supplied by the much lower average power, which proves the validity of the novel system's topology about reducing the power rating of the transformer. The $C_{mid}$ adopted in this simulation is only 100 μF. Including the 100 μF capacitor $C_{boost}$ and 100 μF Cm, the total capacitance is 300 μF in this simulation, which proves that the capacitance is dramatically reduced by the novel system's topology compared to the 1.2 mF+150 uF in existing power converters (FIG. 1A). And 470 uH inductor is also eliminated by the novel system's converter. From the $V_{antenna}$ zoomed in waveform in FIG. 4C, it can be concluded that the series resonant tank operates properly to produce the sine wave without any phase delay and distortion due to the pulse frequency.

A scaled down laboratory experiment has been completed to verify the isolated converter's average power control strategy. The isolated converter can always output average power regardless of the load transient (I_load), so that input current (I_in) is nearly constant. In this condition, input LC filter for pulse frequency harmonics is completely eliminated by the novel system's topology.

Advantages

This disclosure describes a novel power converter architecture that can be applied in pulsed power NMR applications such as in subsea or downhole formation evaluation. By adopting a two-stage topology, this architecture enforces the isolated converter to only transfer average power, which reduces its power rating and the volume of transformer and input filter. Furthermore, due to the boost converter in the second stage, the voltage stability requirement of the storage capacitor can be relaxed, so the volume of Caw also decreased significantly. A 150 V DC to 400 V RF, 20 kW peak power converter is designed for a pulsed NMR application. Simulation and scaled-down experimental results and design analysis are described to prove the validity of the novel system's topology.

The trade-off for this architecture is it needs more switches than the conventional method. However, it can be fixed by adopting GaN or SiC devices which have quite small size and power loss compared with conventional Si-based devices. This approach can also be extended to other pulsed load applications such as Magnetic Resonance Imaging (MRI) in healthcare and pulsed radar.

Improved Circuit Design and Adaptive Burst Mode Control in Phase-Shifted Full Bridge (PSFB) Converters for Higher Efficiency Over a Wide Power Range Adaptive burst mode control, as explained below, can help reduce the system losses for a wide range of load conditions. Hence, an improved circuit design of GaN-based PSFB converters along with a new adaptive burst mode control strategy, to achieve high efficiency over a wide power range, including light loads. The main challenges of PSFB converters addressed in this disclosure are: load-dependent zero-voltage switching (ZVS), transformer saturation, and secondary side ringing. Since switching losses of GaN FETs are dominant at light loads, adaptive burst mode control can be employed to improve the efficiency at lower output power. By periodically switching output current between 0 A and minimum ZVS current, adaptive burst mode control can enable both smaller effective switching frequency and lower switching losses. A correction factor 'k' is adopted in the adaptive burst mode control's current loop PI calculation so that the output current can switch fast without any overshoot that increases the switches' current stress.

Using fast Gallium Nitride (GaN) devices, the PSFB converter can operate at higher frequencies, which increases power density and response speed. However, a higher switching frequency also makes the PSFB converter's inherent drawback, load-dependent ZVS, more prominent. At high switching frequencies, a smaller transformer leakage inductance is needed to reduce the duty loss issue for maintaining sufficient voltage gain, but this will lead to ZVS failure at light loads. When using GaN devices at relatively higher voltages and frequencies, since switching losses are dominant under light load operation due to the $C_{oss}$ capacitance, the total light load efficiency becomes very poor under ZVS failure. Several techniques have been employed to improve the light load efficiency of PSFB converters and they can be overall classified into two types: (i) extending the PSFB converter's ZVS range; and (ii) reducing equivalent switching frequency at light loads.

Under the first classification, many auxiliary circuits have been proposed, but they increase the current stress of the device and cause extra auxiliary circuit loss. Meanwhile, several topology variants are proposed to overcome PSFB's load-dependent ZVS issue, such as triple converter with shared leading legs, converter adopting two series-connected transformers, and the combination of two different PSFB converters. These variants generally have limitations of application scenarios and are not widely used in consideration of system complexity and reliability.

For the second classification, burst mode control is utilized. By forcing the converter to switch in a few large duty cycles by default and then skip some switching cycles, the burst mode control can effectively reduce the overall equivalent switching frequency, thereby reducing the switching losses at light loads. However, this burst mode can only be applied to very light load conditions, since the output current is not actively controlled and continuous large duty cycles may produce high peak currents, damaging the devices.

This disclosure describes an adaptive burst mode control strategy that combines the benefits of the above-mentioned approaches. The novel system's strategy forces the converter to periodically switch output current between 0 A and the minimum ZVS current, but at the same time, the average output current still matches with the load requirement. The equivalent switching frequency decreases due to the presence of converter disabled time slots (0 A current) and the converter maintains the minimum ZVS output current in most switching cycles. It is noteworthy that not all switching cycles can achieve ZVS due to the rising time needed by the output current. To reduce the output current rising time as much as possible, an adaptive current loop PI calculation is also adopted in this disclosure. It can also ensure that no current overshoot occurs during the output current transients (0 A to minimum ZVS), which helps to protect the devices from damage due to over-currents.

The main advantages of the novel system's concepts can be summarized as follows:
  The novel system's adaptive burst mode control strategy can extend PSFB converter's ZVS range and reduce the effective switching frequency concurrently at light load; thereby increasing the light load efficiency drastically.
  The novel system's correction factor 'k' can help adaptive burst mode controller to switch output current between 0 A and minimum ZVS current, quickly and smoothly.
  The developed methods can be extended to other types of DC-DC converters with current control as well, such as buck, boost, buck-boost, multi-level DC-DC, interleaved DC-DC, etc.

Adaptive Burst Mode Design

The GaN FET devices' switching losses become an increasingly dominant part of the total power loss when the load decreases from 100% to 0%. However, it can be seen that Lk can only achieve ZVS when the load is higher than a certain value, say 50%, which causes increasingly poor efficiency at lower power. The main principle of a traditional burst mode control is to make the converter operate in a larger than desired duty cycle during the first N switching cycles and skip the next M-N (M>N) cycles, so that the average output current over M cycles still matches with the load requirement. Therefore, switching loss can reduce to N/M. But this technique can only be applied at no load or very light load (typically 0% to 20% load), otherwise, its uncontrolled default duty ratio will cause over-currents that can damage the devices. An adaptive burst mode control is designed in this section to overcome this issue, so that burst mode can operate in a wider load range.

A. Control Loop Design

Figure 5:
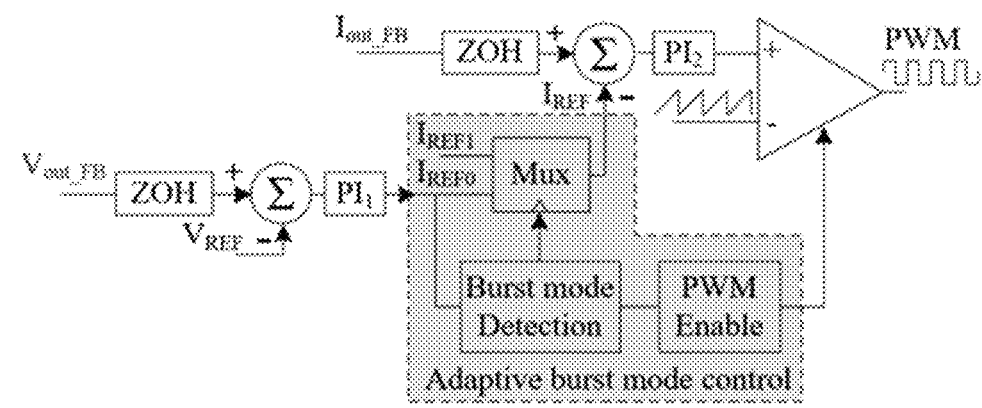
FIG. 5 is a schematic diagram illustrating an adaptive burst mode control loop.
Figure 6:
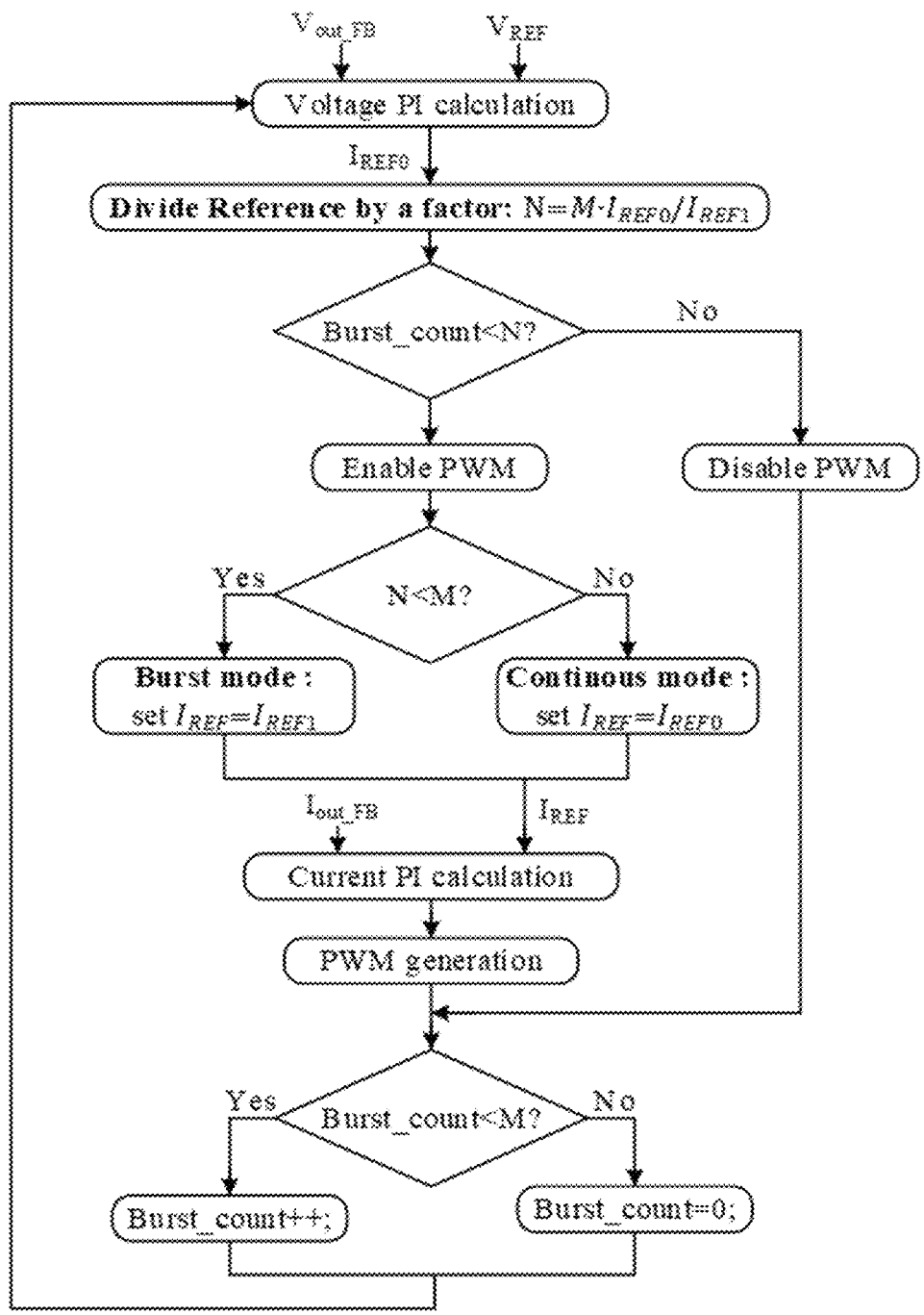
FIG. 6 is a flowchart illustrating an embodiment of a method of controlling the adaptive burst mode control loop shown in FIG. 5.

FIG. 5 is a schematic diagram illustrating an adaptive burst mode control loop. FIG. 6 is a flowchart illustrating an embodiment of a method of controlling the adaptive burst mode control loop shown in FIG. 5. $V_{out\_FB}$ and $I_{out\_FB}$ are the feedback from output voltage and current, respectively. ZOH blocks represent the zero-order holds inside the microcontroller for sampling the feedback signals. The ZOH blocks are set at converter's switching frequency, so that the PI values can be calculated and PWM signals can be updated in every switching cycle. Burst_count in FIG. 6 is a counter to indicate which number of the cycle is the current cycle in the single burst mode period.

At the beginning of each cycle, based on the error between $V_{out\_FB}$ and voltage reference, $V_{REF}$, the outer voltage loop produces a current reference, $I_{REF0}$ that indicates the real required output current. Then, N (the number of PWM enable cycles in a single burst mode period), is calculated by Eq. (3)

$$N \cdot I_{REF1} = M \cdot I_{REF0} \quad (3)$$

where, M is the total number of the cycles in a single burst mode period and $I_{REF1}$ is the minimum current reference that can achieve ZVS.

If $I_{REF0}$ is larger than $I_{REF1}$, N will be larger than M. Then Burst_count will always be smaller than N since Burst_count is smaller than M. Therefore, the controller will operate in continuous mode and the inner current loop will modify the PWM signal to control the output current to follow the current reference, $I_{REF0}$. If $I_{REF0}$ is less than $I_{REF1}$, N will be less than M. Then, for the first N cycles, burst mode will be active and will force the inner current loop to control the output current as $I_{REF1}$ indicates. During the rest of the 'M-N' cycles, the current loop PI calculation will be skipped, PWM will be disabled, and the converter will stop switching.

Since $I_{REF0}$ is updated by voltage PI every cycle, the burst mode controller can adaptively calculate the N value such that the average output current of the whole burst mode period (M cycles) can match with the real load current.

Since the converter switches for only N cycles in every M cycles, the switching loss is reduced. Besides, these N cycles are under current control with the reference $I_{REF1}$, so that ZVS can be achieved, and the overcurrent issue can be avoided.

B. Adaptive Current Loop PI Calculation Design

In adaptive burst mode control, the current loop's PI calculation is directly responsible for the control of output current. Since the current reference always has a step change at the beginning of every burst mode period, an adaptive current loop PI calculation is employed to optimize the step response of the corresponding PI calculation.

Figure 7A:
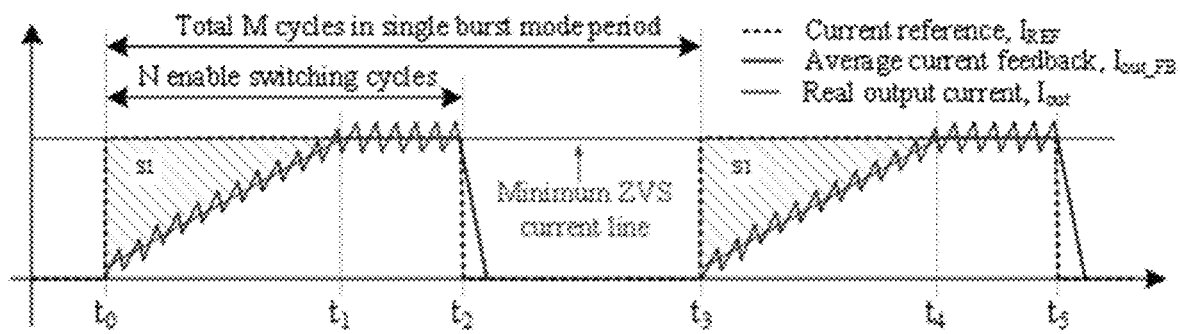
FIG. 7A is a plot illustrating a conventional current loop waveform with proportional-integral (PI) controller calculation (slow output current increasing).
Figure 7B:
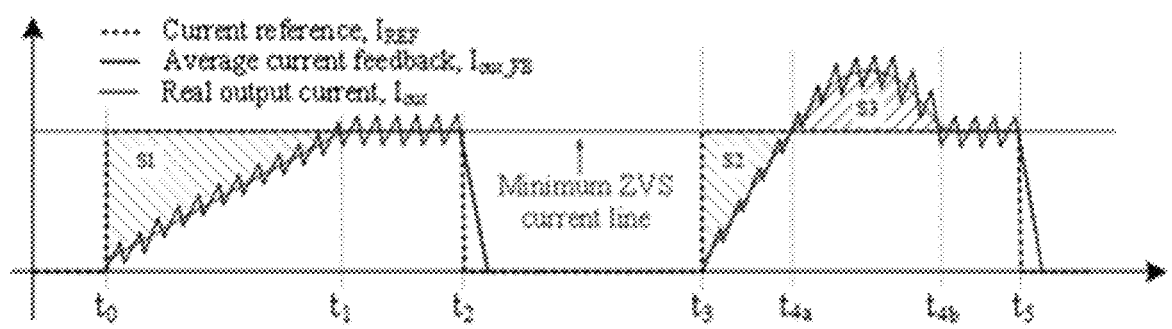
FIG. 7B is a plot illustrating a fast current loop PI calculation (fast output current increasing but inherent current overshoot area S3).
Figure 7C:
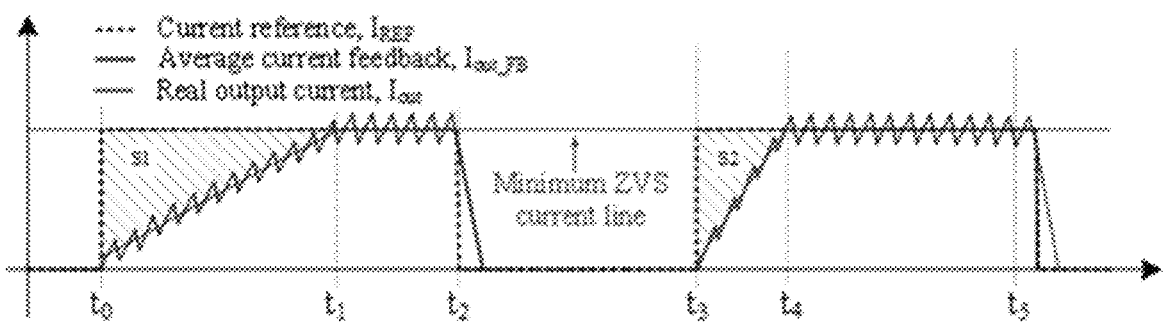
FIG. 7C is a plot illustrating an adaptive current loop PI calculation (fast output current increasing and no inherent current overshoot area).

FIGS. 7A-7C are plots illustrating ideal output current waveforms of different current loop PI calculations. Specifically, FIG. 7A is a plot illustrating a conventional current loop PI calculation (slow output current increasing); FIG. 7B is a plot illustrating a fast current loop PI calculation (fast output current increasing but inherent current overshoot area S3); and FIG. 7C is a plot illustrating an adaptive current loop PI calculation (fast output current increasing and no inherent current overshoot area).

The conventional current loop's PI calculation and output current waveform are shown in FIG. 7A. The current reference $I_{REF}$ can be defined as in Eq. (4).

$$I_{REF} = \begin{cases} I_{REF1}, & 0 < t \le N \cdot T_S \\ 0, & N \cdot T_s < t \le M \cdot T_S \end{cases} \quad (4)$$

where, $I_{REF1}$ is the minimum current reference to ensure ZVS and $T_S$ is the converter switching period. It needs to be mentioned that output current frequency is the double of the converter switching frequency in the PSFB converters.

When the converter starts working in the burst mode, current reference $I_{REF}$ will have a step change at the beginning of the burst mode period, $t_0$. Then, the conventional current PI controller needs the $t_0 \sim t_1$ time slot to increase output current to the minimum ZVS current that $I_{REF1}$ indicates, which results in hard switching at $t_0 \sim t_1$. After $t_2$, the PI value is reset to 0 and the same calculation repeats from $t_3$ to $t_5$. This method loses a lot of ZVS benefits as shown in $t_0 \sim t_1$ and $t_3 \sim t_4$ time slots and increases the N value due to the long start-up time of conventional PI calculation. The conventional current loop PI calculation can be represented as in Eq. (5) and Eq. (6).

$$PI_2(t) = k_P \cdot \text{error}(t) + k_I \cdot \int_{t_0}^{t} \text{error}(t) \cdot dt \quad (5)$$

$$\text{error}(t) = I_{REF}(t) - I_{out\_FB}(t) \quad (6)$$

where the $k_P$ is the proportional gain and $k_I$ is the integral gain. Based on Eq. (5), it can be noticed that the integration calculation depends on the accumulation of transient error, which causes a long start-up time because the integration value is relatively small at the very beginning, around $t_0$.

To reduce the start-up time of conventional PI calculation, the integration value at the previous burst mode period can be added to the beginning of the next burst mode period, which can shorten the accumulation time of the transient error. Meanwhile, since the current PI output is stable from $t_1$ to $t_2$ as shown in the first burst mode period in FIG. 7A, the error between $I_{REF}$ and output current feedback $I_{out\_FB}$ can be assumed to be infinitesimally close to 0 during the stable state. Here, the current loop PI can be represented as in Eq. (7).

$$PI_2(t) = k_I \cdot \int_{t_0}^{t} \text{error}(t) \cdot dt, \quad t_1 < t \le t_2 \quad (7)$$

where, the integration of error(t) is equivalent to $A_{S1}$ (area of S1, same naming method for $A_{S2}$ and $A_{S3}$), shown in FIG. 7A. Thus, Eq. (7) can be simplified to Eq. (8).

$$PI_2(t) = k_I \cdot A_{S1}, \quad t_1 < t \le t_2 \quad (8)$$

By adding the integration value at $t_2$ to the second burst mode period, the fast current loop PI calculation as shown in FIG. 7B can be represented by Eq. (9).

$$PI_2(t) = k_P \cdot \text{error}(t) + k_I \cdot \left[ A_{S1} + \int_{t_3}^{t} \text{error}(t) \cdot dt \right] \quad (9)$$

$A_{S1}$ in Eq. (9) helps current PI to output a higher value, which produces a larger duty cycle after the PWM generator and causes the output current to increase faster than it was in the first burst mode period. When the output current increases to $I_{REF1}$ at $t_{4a}$, the current PI output is given by Eq. (10).

$$PI_2(t_{4a}) = k_P \cdot 0 + k_I \cdot \left[ A_{S1} + \int_{t_3}^{t_{4a}} \text{error}(t) \cdot dt \right] \quad (10)$$

where, $$\int_{t_3}^{t_{4a}} \text{error}(t) \cdot dt$$

can be equivalent to the area of S2. Thus, Eq. (10) can be simplified to Eq. (11).

$$PI_2(t_{4a}) = k_I (A_{S1} + A_{S2}) \quad (11)$$

However, based on Eq. (8), the stable state current PI output should be $k_I \cdot A_{S1}$. Therefore, the current overshoot will appear from $t_{4a}$. When the current recovers to $I_{REF1}$ at $t_{4b}$, the current PI output can be given by Eq. (12).

$$PI_2(t_{4b}) = k_I \cdot \left[ A_{S1} + A_{S2} + \int_{t_{4a}}^{t_{4b}} \text{error}(t) \cdot dt \right] \quad (12)$$

Since error(t) is negative at the $t_{4a} \sim t_{4b}$ slot, $$\int_{t_{4a}}^{t_{4b}} \text{error}(t) \cdot dt$$

is equivalent to $-A_{S3}$. Thus, Eq. (12) can be simplified to Eq. (13).

$$PI_2(t_{4b}) = k_I (A_{S1} + A_{S2} - A_{S3}) \quad (13)$$

To avoid further under/overshoot, $PI_2(t_{4b})$ should be equal to the stable state current PI output as in Eq. (14).

$$k_I \cdot A_{S1} = PI_2(t_{4b}) = k_I (A_{S1} + A_{S2} - A_{S3}) \quad (14)$$

Therefore, $A_{S2}$ should be equal to $A_{S3}$, which means that the amplitude of overshoot depends on the area of S2. If the current overshoot is too large, the GaN device can get damaged due to thermal failure. Thus, $A_{S2}$ should be as small as possible. The minimum $A_{S2}$ can be approximated as in Eq. (15).

$$A_{S2} = \frac{1}{2} \cdot I_{REF1} \cdot (t_{4a} - t_3)_{min} \quad (15)$$

where, $t_{4a} - t_3$ is calculated by Eq. (16).

$$t_{4a} - t_3 = \frac{I_{REF1}}{D \frac{V_{in}}{N \cdot L_{out}} - (1 - D) \frac{V_{out}}{L_{out}}} \quad (16)$$

$$= \frac{I_{REF1}}{D\left(\frac{V_{in} + N \cdot V_{out}}{N \cdot L_{out}}\right) - \frac{V_{out}}{L_{out}}}$$

Since input voltage $V_{in}$, transformer turns ratio N, output inductor $L_{out}$, and output voltage $V_{out}$ are fixed by converter specifications, only increasing duty cycle D can reduce $A_{S2}$. In consideration of duty loss from the primary side to the secondary side and practical application in digital control, maximum duty cycle (less than 0.9, which is based on the discussion in section II, part A) may not sufficiently reduce $t_{4a}-t_3$ for certain converter specifications. Therefore, the fast PI calculation cannot be generally applied to different specifications, without making certain further improvements.

The root cause of failure of fast PI calculation is that it adds total $A_{S2}$ to the next period's integration calculation, which makes overshoot area 'S3' inevitable. A correction factor k is adopted in the adaptive current loop PI calculation as shown in FIG. 7C. k is multiplied to $A_{S2}$ before it is added to the integration calculation in the second period. Then, Eq. (11) in fast PI calculation can be changed to Eq. (17).

$$PI_2(t_4) = k_f(k \cdot A_{S1} + A_{S2}) \quad (17)$$

To avoid any overshoot, $PI_2(t_4)$ should be equal to stable state current PI's output value, which is given by Eq. (18).

$$k_f \cdot A_{S1} = PI_2(t_4) = k_f(k \cdot A_{S1} + A_{S2}) \quad (18)$$

Since there is 0 error at the stable state, Eq. (19) will be true.

$$k_f \cdot A_{S1} = I_{REF1} \quad (19)$$

Then, by combining Eqs. (15), (16), (18), and (19), k can be identified as in Eq. (20).

$$k = 1 - \frac{1}{2} \cdot \frac{I_{REF1} \cdot k_f}{D\left(\frac{V_{in} + N \cdot V_{out}}{N \cdot L_{out}}\right) - \frac{V_{out}}{L_{out}}} \quad (20)$$

Figure 8:
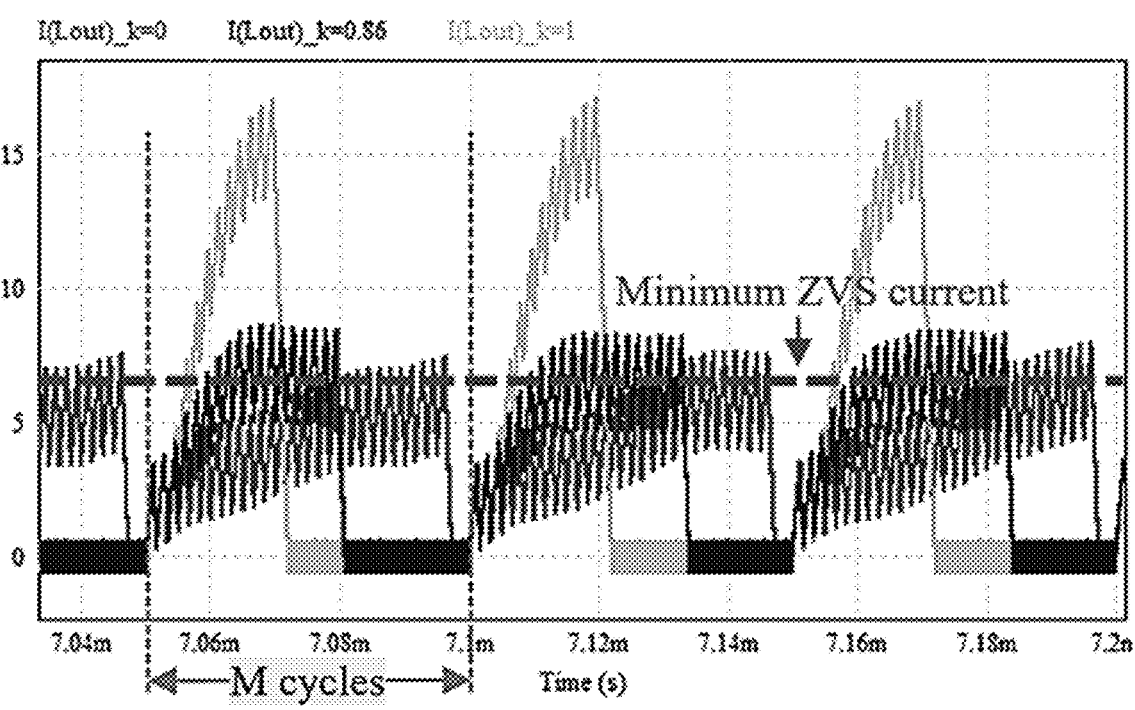
FIG. 8 is a plot illustrating a simulation results comparison of different current loop PI calculations.

FIG. 8 shows the output current results of different current loop PI calculations, where k=0 is equivalent to conventional PI calculation and k=1 is equivalent to fast PI calculation. The k=0.86 in the adaptive current loop PI calculation is deduced from Eq. (20). It can be further noticed that conventional PI calculation responds too slowly to the current reference step change. When M is small enough, output current cannot even rise to the minimum ZVS current in a single burst mode control period. (M is chosen based on the condition that $f_s/M$ is >20 kHz to avoid audile noise). Regardless of the type of current loop PI calculation, the novel system's burst mode control can adaptively calculate the N value to meet the average output current requirement in Eq. (3), which further proves its effectiveness.

Adaptive Burst Mode Control—Results and Discussion

At very light load condition, the adaptive burst mode control operates similar to the conventional burst mode control, since the N value (number of PWM enabled switching cycles in a single burst mode period) is too small for the controller to increase the output current to the minimum ZVS current $I_{REF1}$.

At light load condition, the adaptive burst mode control can control the output current as $I_{REF1}$ indicates. Most switching cycles can achieve ZVS to reduce switching loss which is the dominant power loss at light loads. A very small current overshoot, caused by the calculation errors resulting from integer data-type conversions inside the microcontroller, can be noticed when the output current increases. However, this overshoot does not cause any device failure since it is well within the rating.

At the heavy load condition (over 7.5 A in this prototype), the converter can achieve ZVS naturally. Adaptive burst mode control calculates that N>M. Since the control forces the converter to switch N cycles for every M cycles, N>M can make it operate in continuous mode.

The adaptive burst mode could effectively increase the power efficiency when the prototype converter cannot naturally achieve ZVS (load current less than 7.5 A in this prototype). A significant efficiency improvement of up to 5% is possible when the load current is less than 4.5 A. Moreover, the adaptive burst mode control has the benefit of a wider efficiency-improved load range, compared to the conventional burst mode control. Conventional burst mode is typically applied from no load to 20% load (0 A to 2.4 A in this prototype) to prevent continuous uncontrolled duty cycle, producing high peak currents that can damage the devices.

The main issues faced by GaN-based PSFB converters, such as load-dependent ZVS, transformer saturation, and secondary side ringing, were analyzed in detail and solved in this disclosure. An adaptive burst mode control is contemplated to improve the power efficiency at light load. This adaptive burst mode control could achieve both smaller equivalent switching frequency and smaller single switching loss (ZVS for most switching cycles) at the light load condition, which dramatically improved the light load efficiency. A correction factor 'k' is designed in the current loop PI calculation to ensure that the adaptive burst mode smoothly switches the output current between 0 A and minimum ZVS current. The efficiency comparison also shows a big improvement from 88% to 92.5% at around 3 A load current. The novel system's approach can be very effective in applications such as laboratory power supplies, telecom/server power supplies, etc., which usually face a wide range of load conditions.

GaN-Based Two-Stage Converter with High Power Density and Fast Response for Pulsed Load Applications An isolated converter with large capacitor bank $C_2$ (>>10 mF) is still widely used as the conventional method to supply power for pulsed mode loads. When pulse is on, $S_1$ turns off and $C_2$ supplies the power needed by pulsed load (e.g., RF transmitter). When pulse is off, $S_1$ turns on and isolated converter charges $C_2$ in a relatively smaller current compared with pulse on load current. It can be understood that $S_1$ changes the high PAPR (or Peak-to-Average-Power-Ratio)-low duty ratio-real pulsed load to an equivalent low PAPR-high duty ratio-pulsed load. Therefore, using the novel technique, the isolated converter can be designed with a lower power rating. Moreover, the input filter's size also gets reduced. However, since all the power is supplied by $C_2$ during pulse on, an extremely large capacitance value is needed to maintain the pulse transmitter requirement on output voltage droop and under/overshoot.

With the novel system's input feed forward compensator, the second stage (fast converter, buck, boost or other DC-DC) achieves better line regulation performance which overcomes the load-side issues caused by wide-ranging flexible intermediate DC bus.

Two-Stage Power Conversion

The benefit of using a two-stage structure is that the converter functionalities are split between the stages to meet the specification. The first isolated stage steps down high input voltage to an intermediate level with high efficiency. Whereas the second stage uses lower voltage rating device with less parasitic capacitance ($C_{oss}$) to achieve reduced switching loss at high switching frequency (~1 MHz) operation. The second stage is controlled at high bandwidth to respond quickly to handle pulsed load transients.

Proper selection of topologies and control technique of the two stages plays vital role to achieve the desired specification. An unregulated LLC resonant converter can be used as first stage to achieve high efficiency. However, an unregulated first stage can make it hard to buffer the load pulse at intermediate level when a large range of duty cycles are required. Otherwise, the LLC resonant converters may be a good option as well.

This disclosure discusses an average current control on the first stage and an input feed forward compensator on the second stage to fix the issues of earlier mentioned two-stage converter.

Since a first stage isolated converter is limited to only transferring average power, lower current rating components (transformer and switches) can be utilized. Low PRF current harmonics also shrink dramatically on the input side. A high bandwidth DC-DC converter is designed as the second stage fast converter to meet the pulsed load transient requirement. To compensate for the current difference between continuous average current $I_{avg}$ and pulsed peak current $I_{pulse}$, a midpoint capacitor Caw is adopted.

Fast Converter Design

The second stage 'fast converter' achieves high bandwidth for pulsed load transient. However, a boost converter or other DC-DC converter may be employed based on the particular application specifications.

The varying intermediate (mid-point voltage) can cause a line regulation issue because of wide varying range of $V_{mid}$. An example DC-DC converter transfer function is represented in Eq. (21). Similar dependence on converter input voltage can be seen in other converters such as boost converter as well.

$$G_{vd}(s) = \frac{\Delta V_{out}}{\Delta D} = \frac{R_{load} V_{mid}(1 + sR_c C_{out})}{a_2 s^2 + a_1 s + a_0} \quad (21)$$

$$\begin{cases} a_2 = (R_{load} + R_c) L_{out} C_{out} \\ a_1 = L_{out} + (R_{load} + R_c) R_L C_{out} + R_c R_{load} C_{out} \\ a_0 = R_{load} + R_L \end{cases}$$

It can be noticed that $V_{mid}$ directly affects the loop gain, which causes the poor line regulation of the fast converter.

To improve the line regulation performance, the impact of $V_{mid}$ should be negated by the control loop using a division operation. However, division operation is very time consuming inside the DSP. Considering that the whole control code of the fast converter must complete the execution once every 1 us to update the PWM signal timely at 1 MHz, the practical code needs further optimization.

Figure 9A:
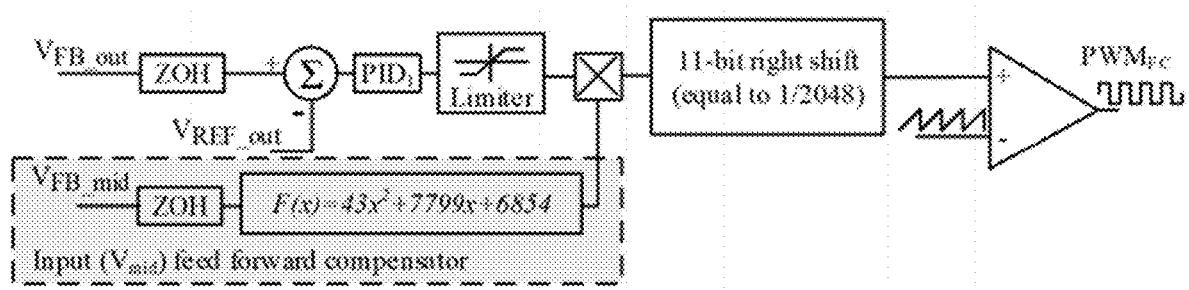
FIG. 9A is a schematic diagram illustrating a fast converter control loop.

Thus, an input feed forward compensator is designed in this controller as shown in FIG. 9A which is a schematic diagram illustrating a fast converter control loop. It uses a second-order approximation function F(x) to imitate the operation of "$1/V_{mid}$". An 11-bit right shift operation (equal to $\frac{1}{2048}$) is used to ensure all coefficients in F(x) are of integer (int) type, which can further reduce the calculation time compared to the ones with decimal parts (float type). It is noteworthy that although $\frac{1}{2048}$ is a division operation, it only takes 1 DSP clock because it was imitated by right shifting 11 bits.

Figure 9B:
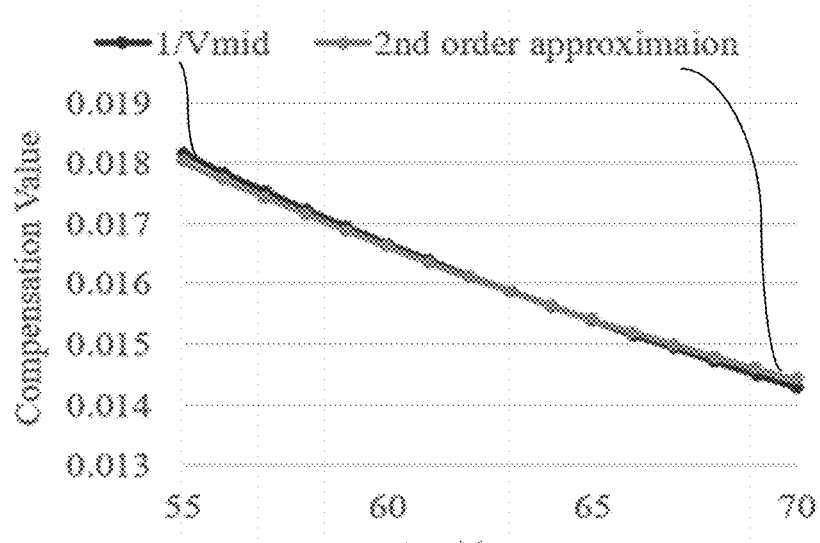
FIG. 9B is a plot illustrating a $1/V_{mid}$ and 2nd-order approximation comparison for the fast converter control loop shown in FIG. 9A.

This $2^{nd}$ order approximation ($F(V_{mid})/2048$) is compared with $1/V_{mid}$ in FIG. 9B which is a plot illustrating a $1/V_{mid}$ and 2nd-order approximation comparison for the fast converter control loop shown in FIG. 9A, which proves the effectiveness of the $2^{nd}$ order approximation.

Figure 10:
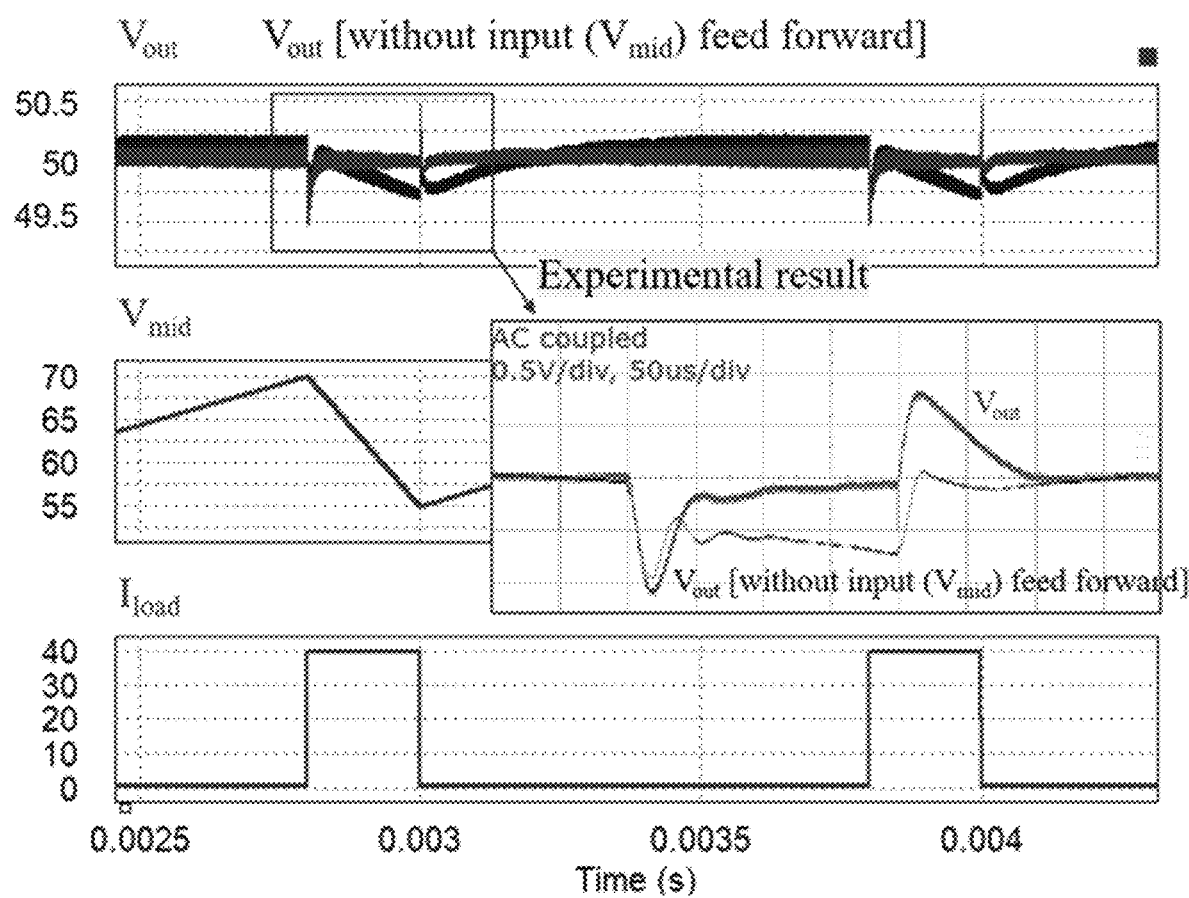
FIG. 10 are plots illustrating simulation and experimental waveforms of line regulation comparison with/without input (Vmid) feed forward.

Fast converter's line regulation with/without input ($V_{mid}$) feed forward compensator is compared in FIG. 10 which are interrelated plots illustrating simulation and experimental waveforms of line regulation comparison with/without input (Vmid) feed forward. Simulation and experimental results both prove that input ($V_{mid}$) feed forward can fix the line regulation issue caused by flexible $V_{mid}$ and the $2^{nd}$ order approximation is an effective method to imitate division operation in the DSP controller.

Exemplary Embodiments

Embodiments are directed to an NMR power supply system including an isolated converter including a transformer. The isolated converter is configured to have a variable voltage at an output thereof. The NMR power supply system also includes an energy storage component. The variable voltage is input to the energy storage component, and the energy storage component is configured to allow the variable voltage to have a voltage droop of greater than 2% (and may be up to 100%) from a peak voltage of the variable voltage. The NMR power supply system further includes a DC-DC converter. A variable voltage from the energy storage component is input to the DC-DC converter, and the DC-DC converter is configured to convert the variable voltage from the energy storage component to a steady output voltage relative to the variable voltage from the energy storage component. The DC-DC converter handles pulsed power but can alternatively handle non-pulsed power. However, in this particular application, the load is pulsed power that can vary in duty cycle, current, pulse repetition frequency, etc. The DC-DC converter can also be easily regulated to allow different output voltage levels, which can make the system versatile. It is noted that the variable output voltage from the isolated converter is the same as the variable voltage of the energy storage component, which is, in-turn, the same as the variable 'input' voltage of the DC-DC converter. The NMR power supply system yet further includes a non-isolated RF signal generator including an NMR coil or an antenna. The steady output voltage is input to the RF signal generator, and the RF signal generator is configured to transmit an RF signal using the NMR coil or antenna. These and other embodiments enforce the isolated converter to only transfer average power, which reduces the power rating and the volume of the transformer. In practice, the isolated converter may also process the power needed to supply the system losses and non-idealities.

The isolated converter's controller will operate in the 'average power' mode or 'average current' mode, including an adaptive burst mode control strategy (described above) to obtain optimal performance for operational changes in the power supply load conditions, aging, temperature, and other situational considerations. This enables the NMR power supply system to be used at high temperature environments such as in downhole applications that have high temperature, shocks, vibrations, etc. The NMR power supply system may also be employed in mission critical and space-constrained pulsed power applications including, but not limited to downhole NMR tools for sub-surface characterization, miniaturized MRI systems in medical equipment, space (crafts, satellites, etc.) and aviation systems.

The power supply system includes two stages. The first stage processes primarily the average power and the second stage processes the pulsed power reacting to fast load transients. Both these stages are coupled by energy storage elements such as capacitors, inductors, 'active capacitors', 'active inductors', supercapacitors, batteries, etc. The first stage converter may be an isolated or non-isolated converter, depending on whether isolation is needed in the application. The second stage DC-DC converter can be an isolated or non-isolated system, so long as it can respond fast to support the RF load pulse transients.

The second stage DC-DC converter has a feed-forward mid-point voltage compensation control technique (described above), which adjusts the converter response for a wide range of voltage, load, duty cycle and temperature variation. This configuration enables the power supply to be used at high temperature environments such as above 75° C.

In an embodiment, the energy storage component comprises at least one component selected from the group consisting of a capacitor, active capacitor, super capacitor, inductor, active inductor, battery, hybrids thereof, and combinations thereof.

In an embodiment, the energy storage component comprises at least one capacitor.

In an embodiment, the DC-DC converter comprises a converter selected from the group consisting of a boost converter, buck converter, buck-boost converter, multi-level DC-DC converter, interleaved DC-DC converter, and combinations thereof.

In an embodiment, the DC-DC converter comprises a feed forward compensator to quickly compensate for the wide voltage variation in the energy storage component and obtain a regulated DC-DC converter output voltage. Since the DC-DC converter is being actively regulated, it doesn't even let its output voltage go out-of-limits. The DC-DC converter can support fast RF pulsed load transients in the sub-microseconds range (even as small as 20 nanoseconds.

In an embodiment, the DC-DC converter comprises GaN switches and/or SiC switches and also includes a fast control strategy to respond to pulsed loads with a stable load voltage regulation.

In an embodiment, the RF signal generator comprises GaN switches and/or SiC switches.

In an embodiment, the RF signal generator comprises a class-D or class-E RF signal generator.

In an embodiment, the RF signal generator comprises switches oriented in an H-bridge configuration.

In an embodiment, the energy storage component is further configured to allow the variable voltage from the energy storage component to have a voltage droop of greater than 50% from the peak voltage of the variable voltage at the output of the isolated converter.

Embodiments are also directed to a method including outputting a variable voltage from an isolated converter. The isolated converter includes a transformer. The method also includes inputting the variable voltage to an energy storage component. The energy storage component allows the variable voltage to have a voltage droop of greater than 2% (and may be up to 100%) from a peak voltage of the variable voltage. The method further includes inputting a variable voltage from the energy storage component to a DC-DC converter. The DC-DC converter converts the variable voltage from the energy storage component to a steady output voltage relative to the variable voltage from the energy storage component. The method yet further includes inputting the steady output voltage to a non-isolated RF signal generator including an NMR coil or an antenna. The RF signal generator transmits an RF signal using the NMR coil or antenna.

Although embodiments are described above with reference to a class-D type RF signal generators, the RF signal generators described in any of the above embodiments may alternatively be other types/classes such as class-E. Such alternatives are considered to be within the spirit and scope of the present invention, and may therefore utilize the advantages of the configurations and embodiments described above.

In addition, although embodiments are described above with energy storage components comprising at least one capacitor (e.g., a capacitor bank), the energy storage components described in any of the above embodiments may alternatively comprise at least one active capacitor, super capacitor, inductor, active inductor, battery, hybrids thereof, or a combination thereof. Such alternatives are considered to be within the spirit and scope of the present invention, and may therefore utilize the advantages of the configurations and embodiments described above.

Further, although embodiments are described above with DC-DC converters comprising a boost converter to keep the transmitter's (RF signal generator's) input voltage regulated), the DC-DC converters described in any of the above embodiments may alternatively comprise a different converter to keep the transmitter's (RF signal generator's) input voltage regulated, such as a buck converter, buck-boost converter, multi-level DC-DC converter, interleaved DC-DC converter, or a combination thereof. Such alternatives are considered to be within the spirit and scope of the present invention, and may therefore utilize the advantages of the configurations and embodiments described above.

Yet further, although embodiments are described above with reference to GaN switches/devices, the switches/devices described in any of the above embodiments may alternatively be other fast type switches/devices such as SiC switches/devices. Such alternatives are considered to be within the spirit and scope of the present invention, and may therefore utilize the advantages of the configurations and embodiments described above.

Wide bandgap semiconductor devices can be used to operate at high switching frequencies even at high temperatures (>75° C.). More specifically, GaN transistors are suitable for developing efficient and compact power converters/supplies in applications that desire Megahertz-scale switching frequencies at kilowatts of power. Using conventional methods, however, the packaging and substrate technologies limit the use of GaN power transistors to applications less than 125° C. Whereas. use of GaN transistors fabricated using GaN-on-GaN, GaN-on-SiC, or GaN-on-Base-Substrate-with-Kovar along with Ceramic or Kovar-based packaging can enable reliable operation of GaN power transistors at temperatures well above 125° C. (including NMR-based subsurface characterization in downhole oil and gas applications).

The method steps in any of the embodiments described herein are not restricted to being performed in any particular order. Also, structures mentioned in any of the method embodiments may utilize structures mentioned in any of the device embodiments. Such structures may be described in detail with respect to the device embodiments only but are applicable to any of the method embodiments.

Features in any of the embodiments described above may be employed in combination with features in other embodiments described above, such combinations are considered to be within the spirit and scope of the present invention.

The contemplated modifications and variations specifically mentioned above are considered to be within the spirit and scope of the present invention.

It's understood that the above description is intended to be illustrative, and not restrictive. The material has been presented to enable any person skilled in the art to make and use the concepts described herein, and is provided in the context of particular embodiments, variations of which will be readily apparent to those skilled in the art (e.g., some of the disclosed embodiments may be used in combination with each other). Many other embodiments will be apparent to those of skill in the art upon reviewing the above description. The scope of the embodiments herein therefore should be determined with reference to the appended claims, along with the full scope of equivalents to which such claims are entitled. In the appended claims, the terms "including" and "in which" are used as the plain-English equivalents of the respective terms "comprising" and "wherein."

What is claimed is:

1. A nuclear magnetic resonance (NMR) power supply system comprising:
   an isolated converter comprising a transformer and a controller, the controller comprising a limiter, wherein an upper limit of the limiter is set as a reference of average power at maximum load,
   wherein the isolated converter is configured to have a variable voltage at an output thereof;
   an energy storage component, wherein the variable voltage is input to the energy storage component, and wherein the energy storage component is configured to allow the variable voltage to have a voltage droop of greater than 2% from a peak voltage of the variable voltage;
   a DC-DC converter, wherein a variable voltage from the energy storage component is input to the DC-DC converter, and wherein the DC-DC converter is configured to convert the variable voltage from the energy storage component to a steady output voltage relative to the variable voltage from the energy storage component; and
   a non-isolated RF signal generator comprising an NMR coil or an antenna, wherein the steady output voltage is input to the RF signal generator, and wherein the RF signal generator is configured to transmit an RF signal using the NMR coil or antenna.

2. The NMR power supply system of claim 1, wherein the energy storage component comprises at least one component selected from the group consisting of a capacitor, active capacitor, super capacitor, inductor, active inductor, battery, hybrids thereof, and combinations thereof.

3. The NMR power supply system of claim 2, wherein the energy storage component comprises at least one capacitor.

4. The NMR power supply system of claim 1, wherein the DC-DC converter comprises a converter selected from the group consisting of a boost converter, buck converter, buck-boost converter, multi-level DC-DC converter, interleaved DC-DC converter, and combinations thereof.

5. The NMR power supply system of claim 1, wherein the DC-DC converter comprises a feed forward compensator.

6. The NMR power supply system of claim 1, wherein the DC-DC converter comprises GaN switches and/or SiC switches.

7. The NMR power supply system of claim 1, wherein the RF signal generator comprises GaN switches and/or SiC switches.

8. The NMR power supply system of claim 1, wherein the RF signal generator comprises a class-D or class-E RF signal generator.

9. The NMR power supply system of claim 1, wherein the RF signal generator comprises switches oriented in an H-bridge configuration.

10. The NMR power supply system of claim 1, wherein the energy storage component is further configured to allow the variable voltage from the energy storage component to have a voltage droop of greater than 50% from the peak voltage of the variable voltage at the output of the isolated converter.

11. A method comprising:
    outputting a variable voltage from an isolated converter, wherein the isolated converter comprises a transformer and a controller, the controller comprising a limiter, wherein an upper limit of the limiter is set as a reference of average power at maximum load;
    inputting the variable voltage to an energy storage component, wherein the energy storage component allows the variable voltage to have a voltage droop of greater than 2% from a peak voltage of the variable voltage;
    inputting a variable voltage from the energy storage component to a DC-DC converter, wherein the DC-DC converter converts the variable voltage from the energy storage component to a steady output voltage relative to the variable voltage from the energy storage component; and
    inputting the steady output voltage to a non-isolated RF signal generator comprising a nuclear magnetic resonance (NMR) coil or an antenna; and
    transmitting, by the RF signal generator, an RF signal using the NMR coil or antenna.

12. The method of claim 11, wherein the energy storage component comprises at least one component selected from the group consisting of a capacitor, active capacitor, super capacitor, inductor, active inductor, battery, hybrids thereof, and combinations thereof.

13. The method of claim 12, wherein the energy storage component comprises at least one capacitor.

14. The method of claim 11, wherein the DC-DC converter comprises a converter selected from the group consisting of a boost converter, buck converter, buck-boost converter, multi-level DC-DC converter, interleaved DC-DC converter, and combinations thereof.

15. The method of claim 11, wherein the DC-DC converter comprises a feed forward compensator.

16. The method of claim 11, wherein the DC-DC converter comprises GaN switches and/or SiC switches.

17. The method of claim 11, wherein the RF signal generator comprises GaN switches and/or SiC switches.

18. The method of claim 11, wherein the RF signal generator comprises a class-D or class-E RF signal generator.

19. The method of claim 11, wherein the RF signal generator comprises switches oriented in an H-bridge configuration.

20. The method of claim 11, wherein the energy storage component further allows the variable voltage from the energy storage component to have a voltage droop of greater than 50% from the peak voltage of the variable voltage at the output of the isolated converter.

* * * * *

UNITED STATES PATENT AND TRADEMARK OFFICE
CERTIFICATE OF CORRECTION

| | | |
|---|---|---|
| PATENT NO. | : 11,742,808 B1 | Page 1 of 1 |
| APPLICATION NO. | : 17/945811 | |
| DATED | : August 29, 2023 | |
| INVENTOR(S) | : Harish S. Krishnamoorthy et al. | |

It is certified that error appears in the above-identified patent and that said Letters Patent is hereby corrected as shown below:

In the Specification

Column 1, Line 5 - Replace:
"None."

With:
--This invention was made with government support under grant number DE-AR0001582 awarded by the Department of Energy. The government has certain rights in the invention.--

Signed and Sealed this
Twenty-fourth Day of June, 2025

Coke Morgan Stewart
*Acting Director of the United States Patent and Trademark Office*